US009536893B2

(12) United States Patent
Hsiao et al.

(10) Patent No.: US 9,536,893 B2
(45) Date of Patent: Jan. 3, 2017

(54) THREE-DIMENSIONAL MEMORY AND METHOD FOR MANUFACTURING THE SAME

(71) Applicant: MACRONIX INTERNATIONAL CO., LTD., Hsinchu (TW)

(72) Inventors: Yi-Hsuan Hsiao, Hsinchu (TW); Wei-Chen Chen, Taoyuan County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/541,169

(22) Filed: Nov. 14, 2014

(65) Prior Publication Data

US 2016/0141300 A1   May 19, 2016

(51) Int. Cl.
*H01L 21/283* (2006.01)
*H01L 23/48* (2006.01)
*H01L 23/535* (2006.01)
*H01L 21/768* (2006.01)
*H01L 23/528* (2006.01)
*H01L 27/115* (2006.01)

(52) U.S. Cl.
CPC ... *H01L 27/11582* (2013.01); *H01L 27/11575* (2013.01)

(58) Field of Classification Search
CPC ............ H01L 27/1157; H01L 27/11582; H01L 27/115; H01L 27/11524; H01L 27/11521
USPC ............ 257/321, E21.422, E21.69, E27.103; 438/257, 258, 264, 593, 286
See application file for complete search history.

(56) References Cited

U.S. PATENT DOCUMENTS

| 6,696,334 B1* | 2/2004 | Hellig | H01L 21/823864 257/E21.64 |
| 2002/0058380 A1* | 5/2002 | Parekh | H01L 27/10894 438/253 |
| 2007/0210372 A1* | 9/2007 | Park | H01L 27/115 257/321 |
| 2008/0067554 A1 | 3/2008 | Jeong et al. | |
| 2008/0157092 A1* | 7/2008 | Arai | H01L 27/115 257/67 |
| 2011/0241114 A1 | 10/2011 | Su et al. | |
| 2012/0181701 A1* | 7/2012 | Chen | H01L 23/50 257/774 |

FOREIGN PATENT DOCUMENTS

| TW | 200816460 A | 4/2008 |
| TW | 201135928 A | 10/2011 |

OTHER PUBLICATIONS

TIPO Office Action dated May 19, 2016 in Taiwan application (No. 103139462).

* cited by examiner

*Primary Examiner* — Kimberly Rizkallah
*Assistant Examiner* — Brian Turner
(74) *Attorney, Agent, or Firm* — McClure, Qualey & Rodack, LLP

(57) ABSTRACT

A three-dimensional (3D) memory and a method for manufacturing the same are disclosed. According to one embodiment, the 3D memory comprises a thin-film transistor. The thin-film transistor has a source region and a drain region disposed separately. The source region comprises a first source region and a second source region disposed between the first source region and the drain region. The first source region is p-type of doping, the second source region is n-type of doping, and the drain region is n-type of doping.

8 Claims, 11 Drawing Sheets

THREE-DIMENSIONAL MEMORY AND METHOD FOR MANUFACTURING THE SAME

TECHNICAL FIELD

The disclosure relates in general to a memory and a method for manufacturing the same, more particularly to a three-dimensional (3D) memory and a method for manufacturing the same.

BACKGROUND

A typical thin-film transistor may be erased by providing holes to boost channel potential. In a conventional planar structure, the substrate can play the role of providing holes. In contrast, in a 3D structure, such as a 3D NAND flash memory, a thin-film transistor may not contact the substrate directly, and thus it is not easy to obtain holes from the substrate. One method to provide holes to such a thin-film transistor is inducing holes by gate-induced drain leakage (GIDL). However, it is sensitive to local electric field and needs a long time to provide sufficient amount of holes. Besides, GIDL stress may damage the gate oxide and degrades the reliability. Another method is using a p-type source instead of a n-type source. However, when the thin-film transistor using a p-type source is read, a voltage drop is occurred.

SUMMARY

In this disclosure, a new structure is provided to solve the above problems. A method for manufacturing the same is also provided.

According to one embodiment, a 3D memory is provided. The 3D memory comprises a thin-film transistor. The thin-film transistor has a source region and a drain region disposed separately. The source region comprises a first source region and a second source region disposed between the first source region and the drain region. The first source region is p-type of doping, the second source region is n-type of doping, and the drain region is n-type of doping.

According to another embodiment, a method for manufacturing a 3D memory is provided. The method comprises the following steps. First, a stack of alternating conductive layers and insulating layers is formed on a substrate. A source region of a thin-film transistor of the 3D memory is formed. This step comprises: forming a through hole through the stack; forming a n-type doping layer on sidewalls of the through hole; and filling a p-type doping material into the through hole on the n-type doping layer. A drain region of the thin-film transistor separated from the source region is formed. This step comprises: forming a sequence of through holes respectively connecting the conductive layers of the stack; and filling a n-type doping material into the sequence of through holes.

Figure 1A:
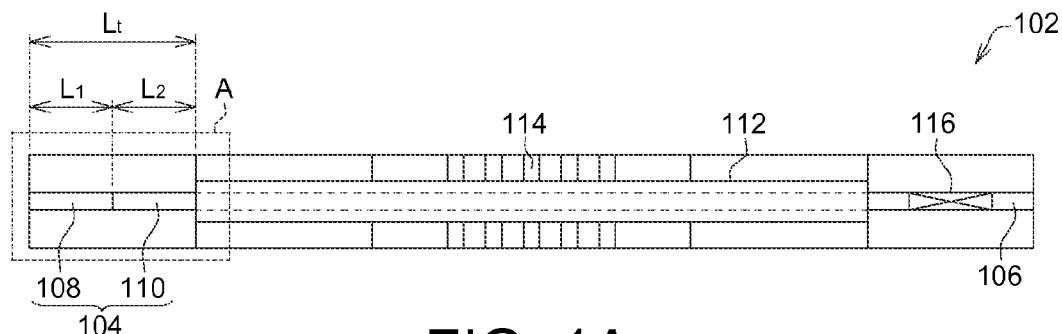
FIGS. 1A-1C illustrate a part of a 3D memory according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
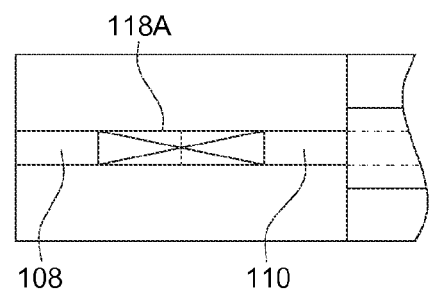
Figure 1C:
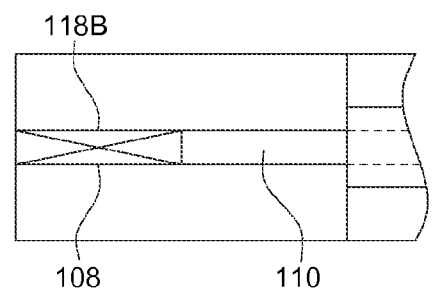

Referring to FIGS. 1A-1C, a part of a 3D memory according to one embodiment is illustrated, wherein FIGS. 1B and 1C shows the enlarged views of the region A in FIG. 1A. The 3D memory comprises a thin-film transistor 102. For easiness of illustration, the 3D memory shown in the figures is a 3D NAND flash memory, and the thin-film transistor 102 may be provided for a memory cell as a cell transistor. However, the present invention may be adapted to other kinds of 3D memory comprising a thin-film transistor, and to thin-film transistors of other usage.

The thin-film transistor 102 has a source region 104 and a drain region 106 disposed separately. The source region 104 comprises a first source region 108 and a second source region 110 disposed between the first source region 108 and the drain region 106. A length of the first source region 108 is $L_1$, a length of the second source region 110 is $L_2$, and a total length of the source region 104 is $L_t$. In one example, $L_t$ equals to 0.3 μm. The first source region 108 is p-type of doping, the second source region 110 is n-type of doping, and the drain region 106 is n-type of doping.

Since the source region 104 comprises a p-type first source region 108, a stable and fast hole source is provided. Unlike the case using only a p-type source, the source region 104 also comprises a n-type second source region 110. As such, a voltage drop will not occur when read the thin-film transistor 102 according to the embodiment. Further, the disadvantages of using GIDL-induced holes, such as unstable, time-consuming, structure damage, etc., can be avoided.

The 3D memory may further comprise a source contact and a drain contact 116. In one embodiment, as shown in FIG. 1B, the source contact 118A connects both the first source region 108 and the second source region 110. In another embodiment, as shown in FIG. 1C, the source contact 118B connects the first source region 108 only, and does not connect the second source region 110. In both embodiments, the length $L_2$ of the second source region 110 may be equal to or lower than 0.02 μm. The drain contact 116 connects the drain region 106.

Figure 4A:
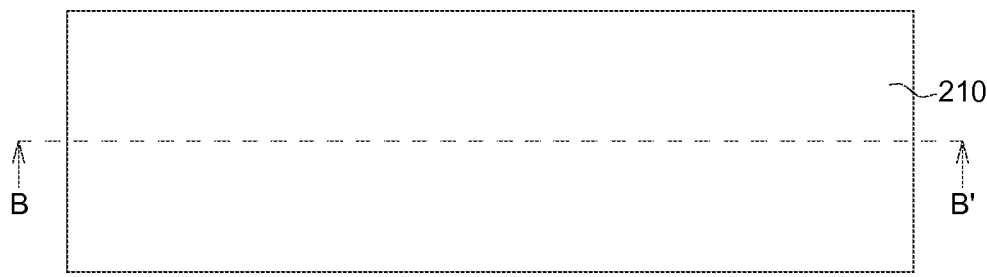
FIGS. 4A-11B illustrate a method for manufacturing a 3D memory according to one embodiment.
Figure 4B:
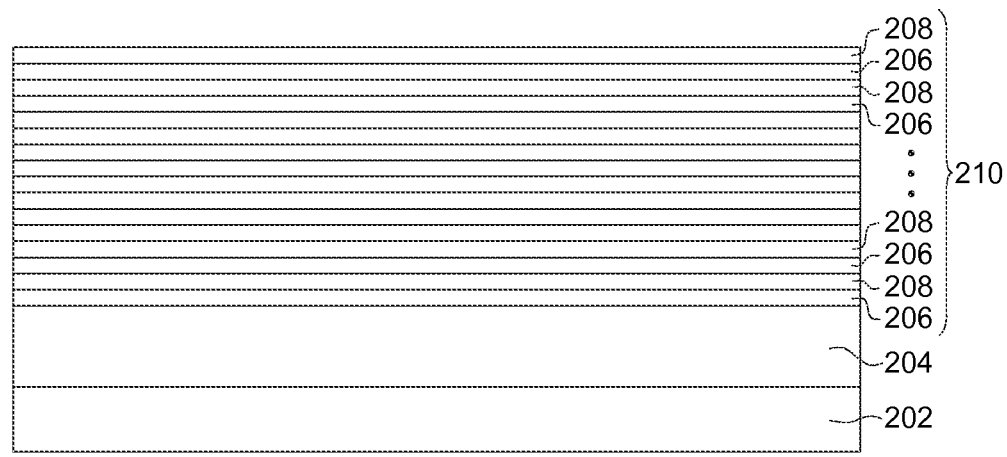

The 3D memory may further comprise a substrate (as shown in FIG. 4B), a bit line 112 disposed on the substrate, and a word line 114 disposed on the substrate and orthogonal to the bit line 112. The source region 104 and the drain region 106 may be disposed along the bit line 112 and not contact the substrate directly.

Figure 2A:
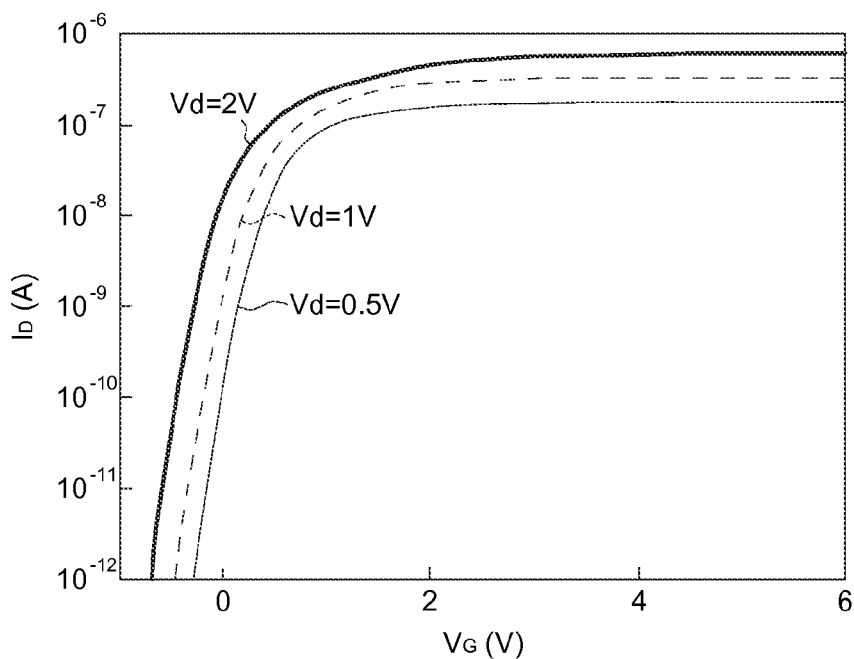
FIGS. 2A-2B show characteristics of an example according to one embodiment and a comparative example.
Figure 2B:
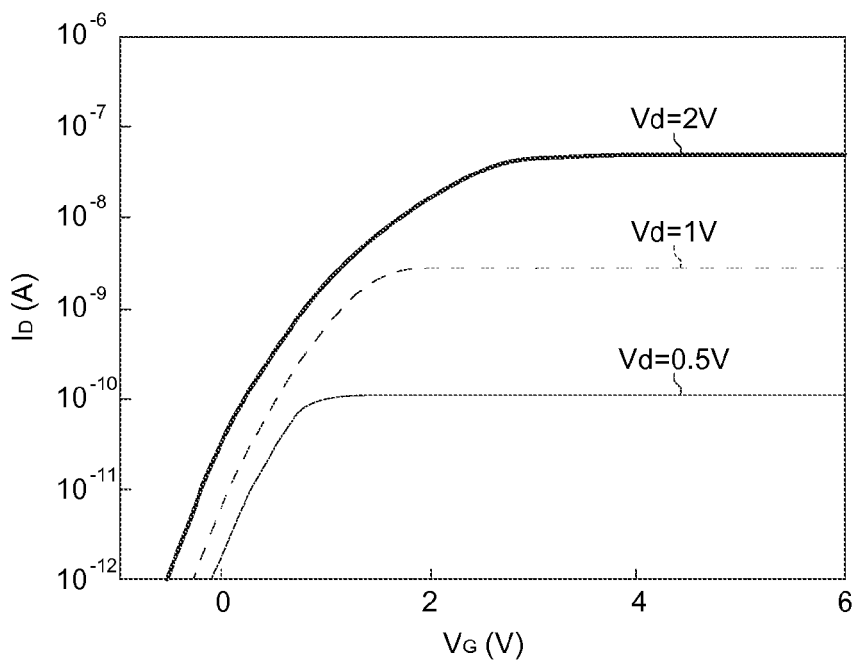

FIGS. 2A-2B show characteristics of an example according to one embodiment and a comparative example thereof when the thin-film transistors of the example and the comparative example are read. For the example shown in FIG. 2A, the source contact 118A connects both the p-type first source region 108 and the n-type second source region 110. For the comparative example shown in FIG. 2B, the source contact 118B connects only the p-type first source region 108. For both the example shown in FIG. 2A and the comparative example shown in FIG. 2B, $L_t$ equals to 0.3 μm, and $L_1$ and $L_2$ equal to 0.15 μm. In the comparative example, because the p-n junction between the first source region 108 and the second source region 110 is reverse-biased during reading, $I_D$ current is predominated by band-to-band tunneling and strongly depends on Vd bias. While in the example in which the source contact 118A also connects the n-type source region, the $I_D$-$V_G$ curves exhibit the typical behavior of n-channel reading.

Figure 3:
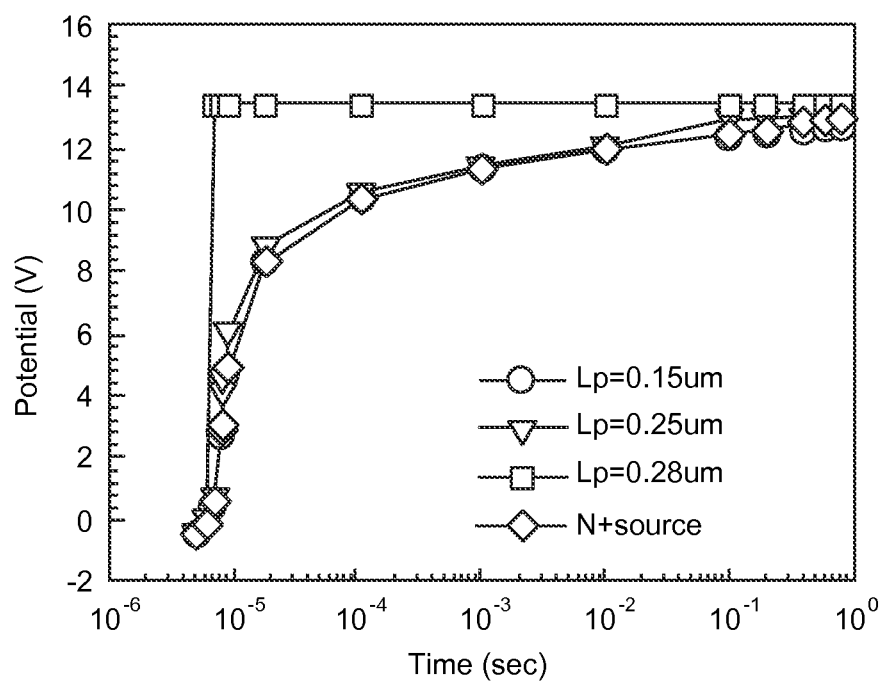
FIG. 3 shows characteristics of an example according to one embodiment and comparative examples.

FIG. 3 shows characteristics of an example according to one embodiment and comparative examples thereof when the thin-film transistors of the example and the comparative examples are erased. For all of the example and the comparative examples, $L_t$ equals to 0.3 µm. When the n-type second source region 110 is short enough, such as equal to or lower than 0.02 µm, the hole provided from the p-type first source region 108 can more easily and rapidly pass through the second source region 110. As such, the erase speed is further improved. According to one embodiment, the source contact may connect both the p-type first source region 108 and the n-type second source region 110. According to an alternative embodiment, the source contact may connect only the p-type first source region 108.

Now referring to FIGS. 4A-11B, a method for manufacturing a 3D memory according to one embodiment is illustrated, wherein the figures indicated by "B" shows cross-sectional views taken along the line B-B' in the corresponding figures indicated by "A". First, as shown in FIGS. 4A and 4B, a substrate 202 is provided, and a stack 210 of alternating conductive layers 206 and insulating layers 208 is formed on the substrate 202. In one embodiment, a buried layer 204 may be formed between the substrate 202 and the stack 210.

Figure 5A:
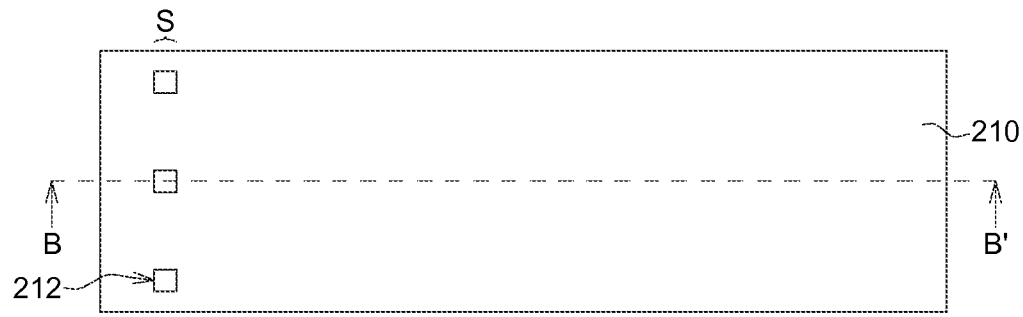
Figure 5B:
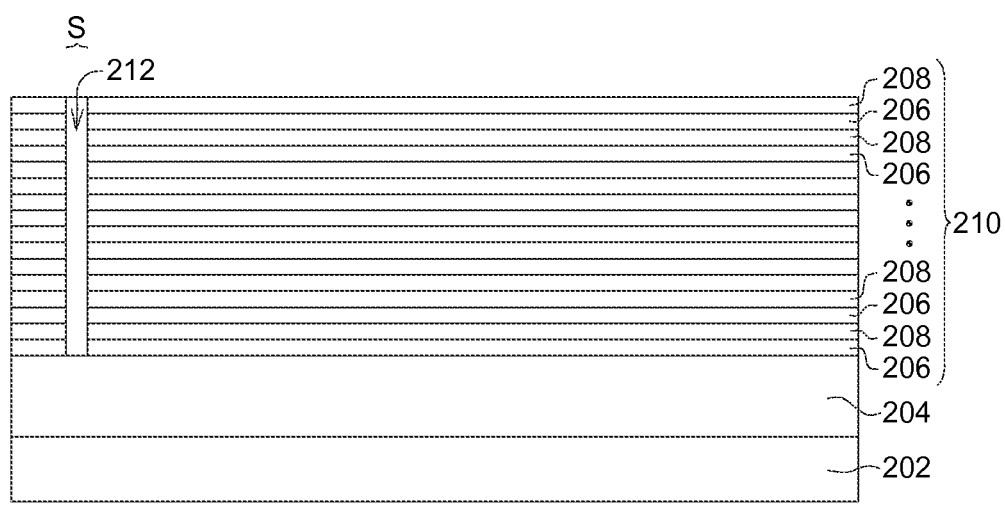
Figure 6A:
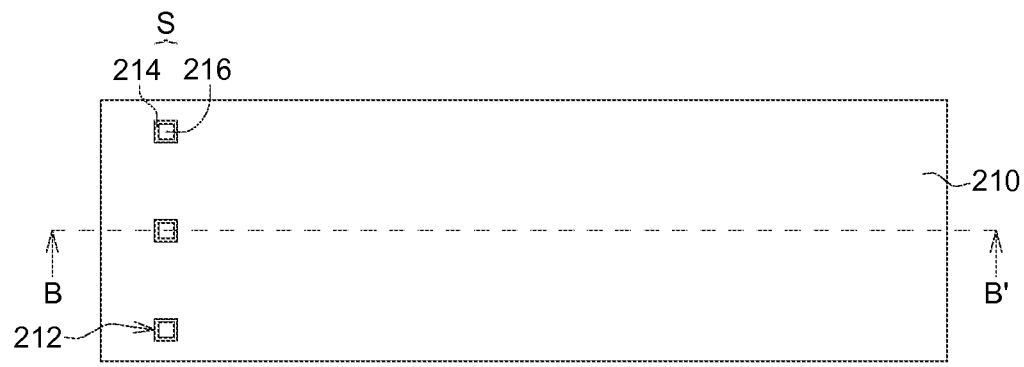
Figure 6B:
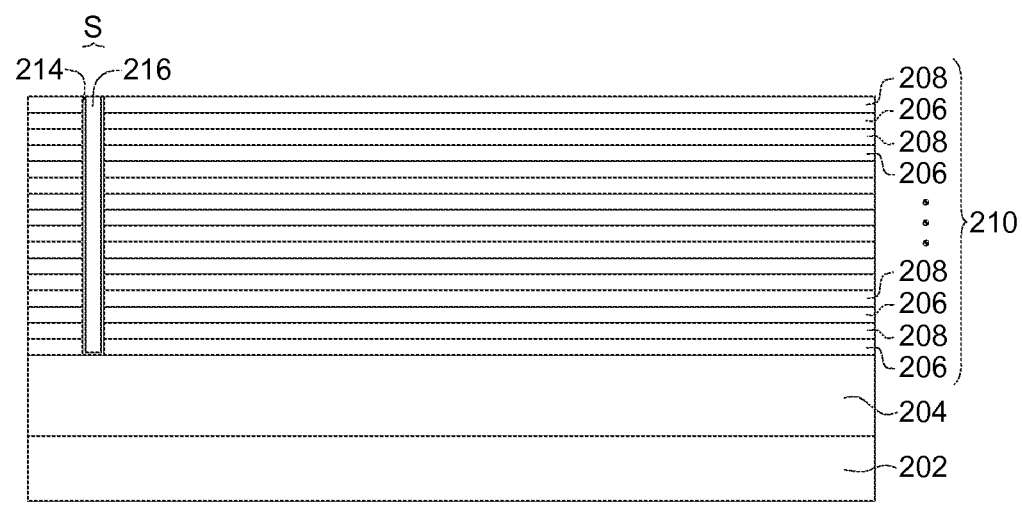

A source region S of a thin-film transistor of the 3D memory is formed, as shown in FIGS. 5A-6B. Referring to FIGS. 5A and 5B, a through hole 212 is formed through the stack 210. Referring to FIGS. 6A and 6B, a n-type doping layer 214 is formed on sidewalls of the through hole 212, and a p-type doping material 216 is filled into the through hole 212 on the n-type doping layer 214. In one embodiment, the thickness of the n-type doping layer 214 may be equal to or lower than 0.02 µm.

Figure 7A:
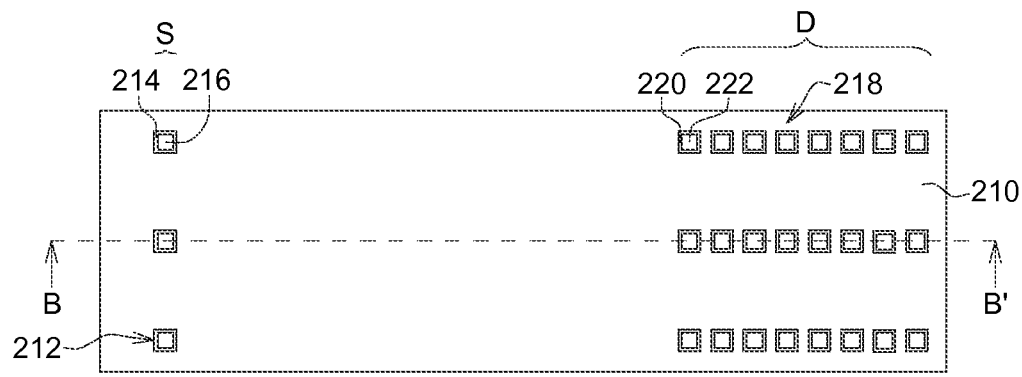
Figure 7B:
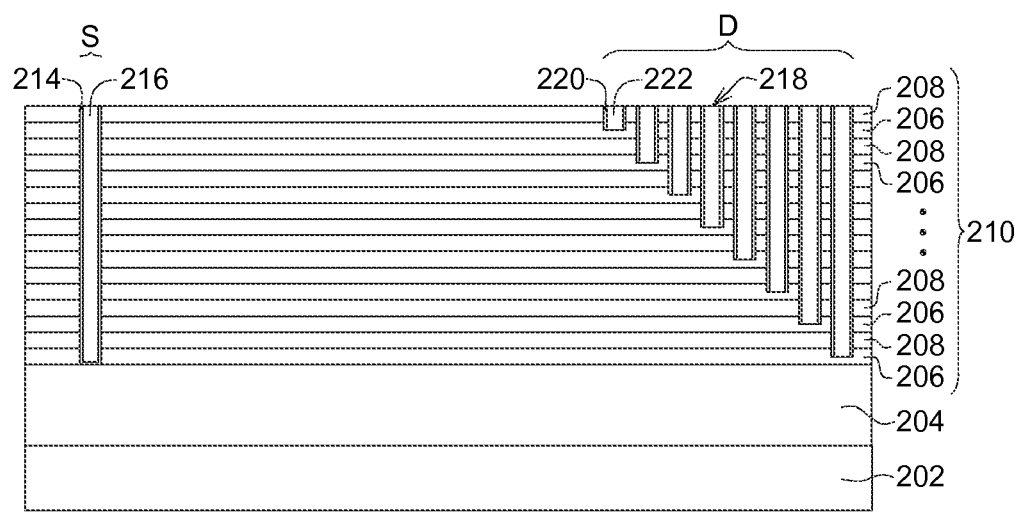

A drain region D of the thin-film transistor is formed, as shown in FIGS. 7A-7B. The drain region D is separated from the source region S. A sequence of through holes 218 are formed respectively connecting the conductive layers 206 of the stack 210. An insulating layer 220 may be formed on sidewalls of the through holes 218. Then, unnecessary material is removed by etching, and a n-type doping material 222 is filled into the sequence of through holes 218.

Figure 8A:
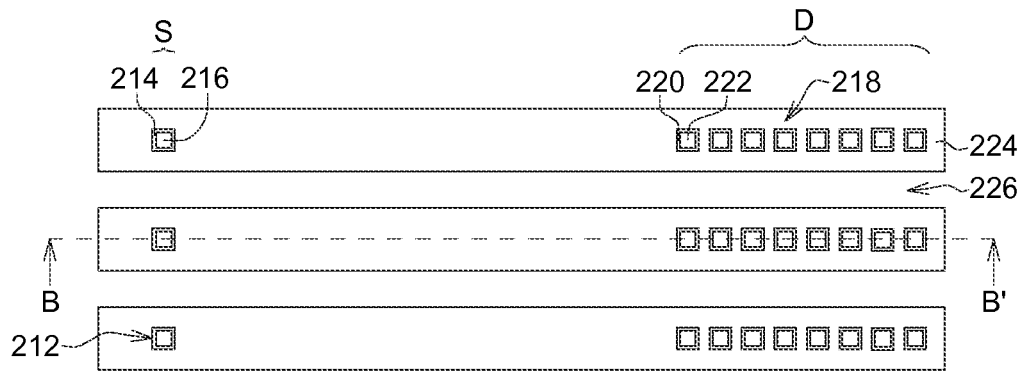
Figure 8B:
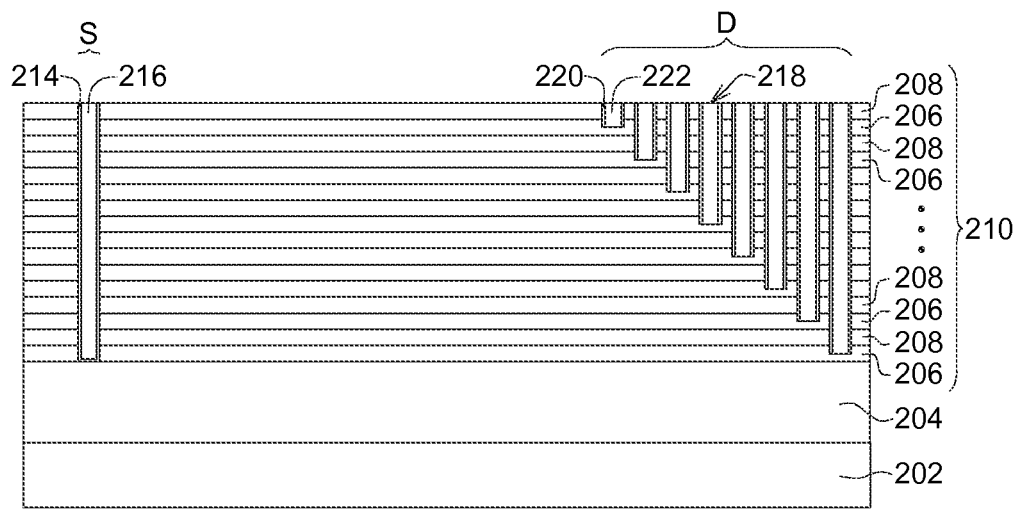
Figure 9A:
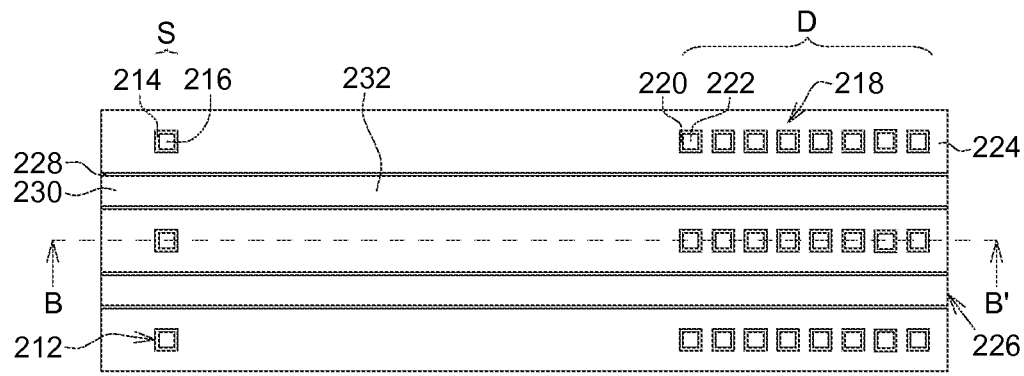
Figure 9B:
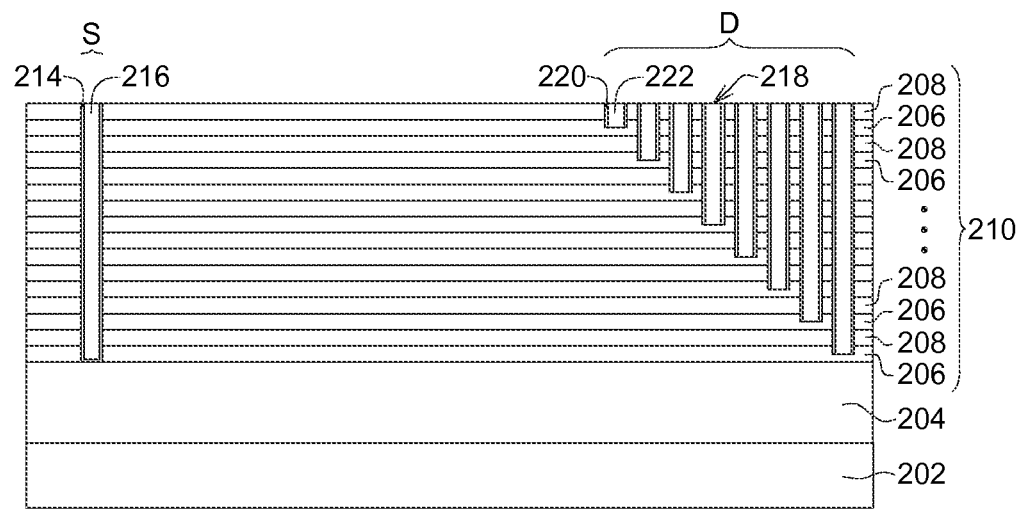
Figure 10A:
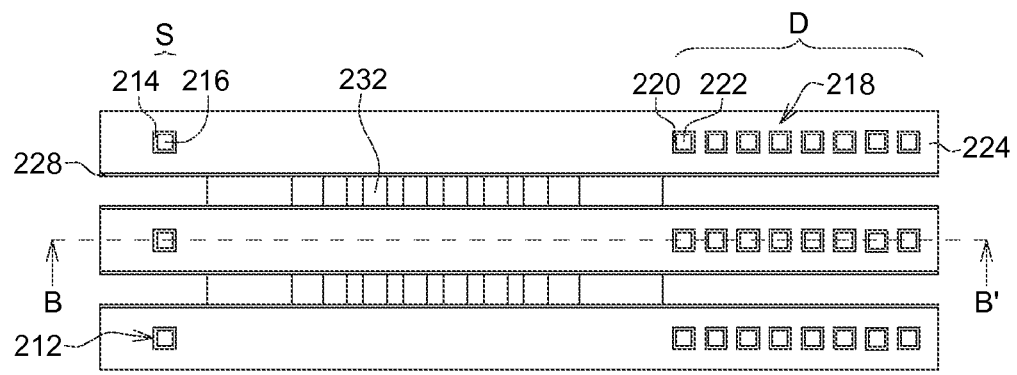
Figure 10B:
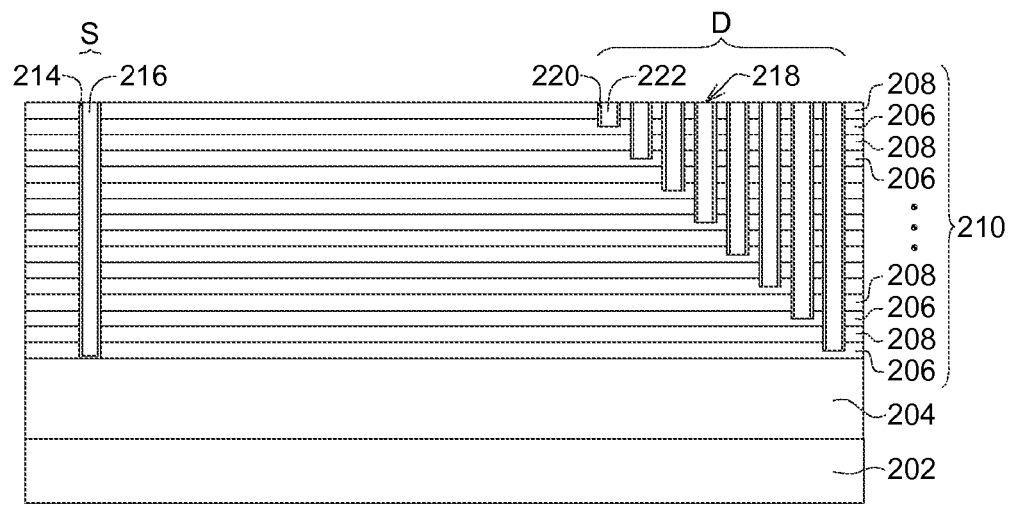
Figure 11A:
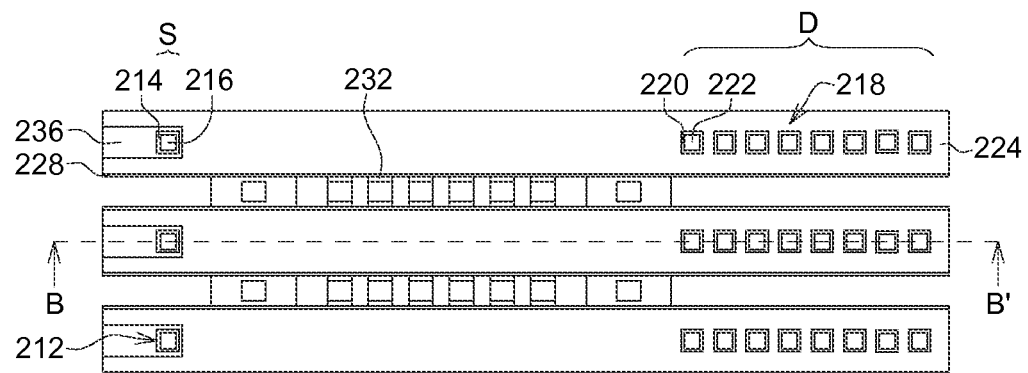
Figure 11B:
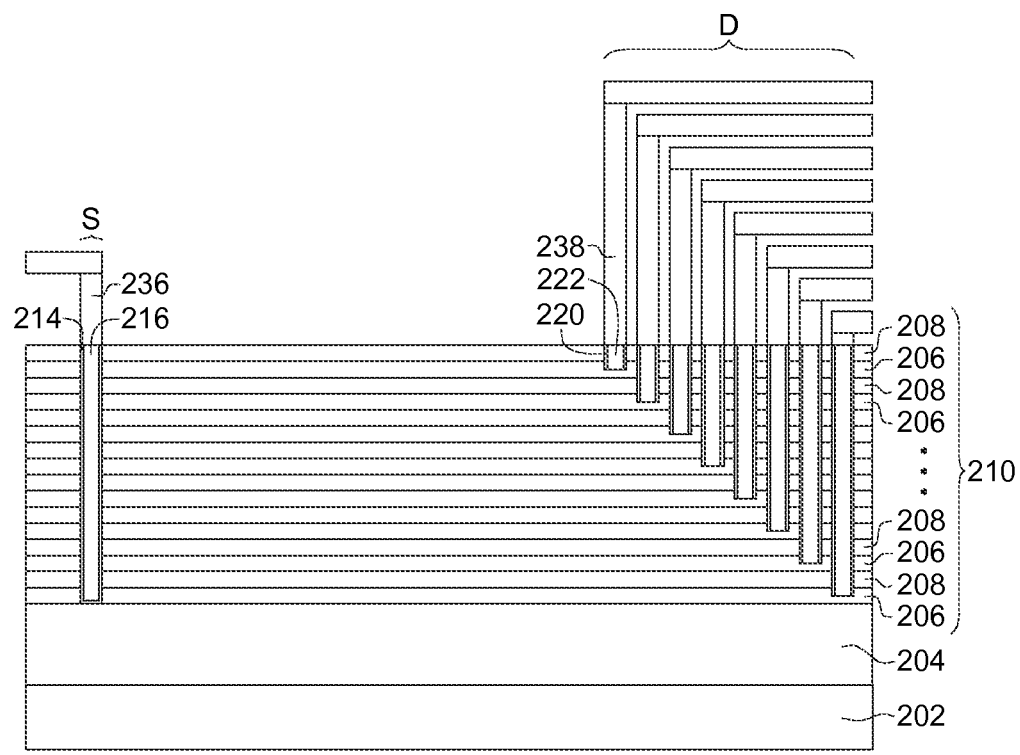

Bit lines 224 and word lines 232 are formed, as shown in FIGS. 8A-10B. Referring to FIGS. 8A and 8B, the stack 210 is patterned to form a plurality of bit lines 224 separated by trenches 226. Referring to FIGS. 9A and 9B, an oxide-nitride-oxide (ONO) structure 228 is formed on sidewalls of the trenches 226 between the bit lines 224, and a conductive material 230, such as poly-silicon, is filled into the trenches 226. Referring to FIGS. 10A and 10B, a plurality of word lines 232 is formed by patterning the conductive material 230.

The sequence of forming the source region S, the drain region D, and the bit lines 224 and word lines 232 may be exchanged. Then, referring to FIGS. 11A and 11B, a source contact 236 and a plurality of drain contacts 238 are formed. In one embodiment, the source contact 236 connects both the p-type doping material 216 and the n-type doping layer 214. In an alternative embodiment, the source contact 236 connects the p-type doping material 216 and does not connect the n-type doping layer 214. The drain contacts 238 connect the n-type doping material 222 in the sequence of through holes 218.

According to the method described above, the 3D memory according to the embodiments, in which a stable and fast hole source is provided, can be easily fabricated. However, this method is provided only for explanation, and other methods to manufacture a 3D memory according to the embodiments may be carried out.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A three-dimensional (3D) memory, comprising:
a thin-film transistor having a source region and a drain region disposed separately, wherein each of the source region and the drain region penetrates through at least a part of a stack, wherein the source region comprises a first source region and a second source region disposed between the first source region and the drain region, and wherein the first source region is p-type of doping, the second source region is n-type of doping, and the drain region is n-type of doping;
wherein the stack is formed of alternating conductive layers and insulating layers, a through hole is formed through the stack, a n-type doping layer is formed on sidewalls of the through hole, and a p-type doping material is filled into the through hole on the n-type doping layer, wherein the n-type doping layer forms the second source region, and the p-type doping material forms the first source region.

2. The 3D memory according to claim 1, further comprising:
a source contact connecting both the first source region and the second source region; and
a drain contact connecting the drain region.

3. The 3D memory according to claim 1, further comprising:
a source contact connecting the first source region and not connecting the second source region; and
a drain contact connecting the drain region.

4. The 3D memory according to claim 3, wherein a length of the second source region is equal to or lower than 0.02 µm.

5. The 3D memory according to claim 1, wherein a length of the second source region is equal to or lower than 0.02 µm.

6. The 3D memory according to claim 1, wherein the thin-film transistor is provided for a memory cell.

7. The 3D memory according to claim 1, further comprising:
a substrate; and
the stack of bit lines disposed on the substrate;
wherein the source region and the drain region are disposed along the bit lines and do not contact the substrate directly.

8. The 3D memory according to claim 7, further comprising:
a word line disposed on the substrate and orthogonal to the bit lines.

* * * * *